(12) United States Patent
Chen et al.

(10) Patent No.: US 6,897,691 B2
(45) Date of Patent: May 24, 2005

(54) PHASE LOCKED LOOP WITH LOW STEADY STATE PHASE ERRORS AND CALIBRATION CIRCUIT FOR THE SAME

(75) Inventors: Chih-Cheng Chen, Hsin Chu (TW); Tse-Hsiang Hsu, Hsin Chu (TW)

(73) Assignee: Mediatek Inc., Hsinchu (TW)

(*) Notice: Subject to any disclaimer, the term of this patent is extended or adjusted under 35 U.S.C. 154(b) by 0 days.

(21) Appl. No.: 10/437,906

(22) Filed: May 15, 2003

(65) Prior Publication Data

US 2003/0214332 A1 Nov. 20, 2003

(30) Foreign Application Priority Data

May 20, 2002 (TW) ........................................ 91110833 A

(51) Int. Cl.[7] ................................................ H03L 7/00
(52) U.S. Cl. ...................................... 327/153; 327/156
(58) Field of Search ................................ 327/149, 150, 327/152, 153, 156, 158, 161, 162; 331/12, 17; 375/373, 374, 375, 376

(56) References Cited

U.S. PATENT DOCUMENTS

| | | | |
|---|---|---|---|
| 5,260,842 A | * 11/1993 | Leake et al. | ................... 360/51 |
| 5,594,376 A | * 1/1997 | McBride et al. | ............ 327/236 |
| 6,236,697 B1 | * 5/2001 | Fang | .......................... 375/376 |
| 6,359,950 B2 | * 3/2002 | Gossmann et al. | ......... 375/376 |

* cited by examiner

Primary Examiner—Linh My Nguyen
(74) Attorney, Agent, or Firm—Birch Stewart Kolasch & Birch, LLP

(57) ABSTRACT

A phase locked loop (PLL) with low steady state phase errors utilizes a delay unit to delay an input signal or a reference clock so as to lower the steady state phase errors of the PLL. A calibration circuit is used to adjust the delay time of the delay unit and includes a signal generator for generating a simulation input signal and a simulation reference clock according to a phase locked clock; a delay unit for delaying the simulation reference clock and generating a delayed reference clock; a phase detector for detecting the phase error between the simulation input signal and the delayed reference clock and generating charge control signals; a charge pump and an integrator for generating an error voltage according to the charge control signals; a delay time control unit for adjusting the delay time of the delay unit according to the error voltage; and a voltage control oscillator for generating the oscillation clock according to a reference control voltage.

13 Claims, 6 Drawing Sheets

PHASE LOCKED LOOP WITH LOW STEADY STATE PHASE ERRORS AND CALIBRATION CIRCUIT FOR THE SAME

BACKGROUND OF THE INVENTION

1. Field of the Invention

The invention relates to a phase locked loop, and more particularly to a phase locked loop, which has low steady state phase errors by utilizing a delay unit to delay a phase of an input signal or a reference clock so as to compensate for the circuit property, and a calibration circuit for the same.

2. Description of the Related Art

FIG. 1 shows a block diagram of a conventional phase locked loop (hereinafter is called PLL). The PLL is used to provide a phase locked clock PLCK in sync with the phase of the input signal IN. For example, when an optical drive is reading the data on an optical disc medium, the PLL is used to lock the phase and frequency of the EFM (Eight-to-Fourteen Modulation) signal and output a phase locked clock PLCK as a sampling clock or other control reference clocks for the EFM signal. Referring to FIG. 1, the conventional PLL 10 includes a phase detector 11, a charge pump 12, a loop filter 13, a voltage control oscillator (VCO) 14, and a frequency divider 15. The phase detector 11 detects the phase difference between the input signal IN and the phase locked clock PLCK, and outputs charge control signals UP and DOWN to control the charge pump 12 according to the phase difference. For example, when the phase of the phase locked clock PLCK leads that of the input signal IN, the pulse width of the charge control signal UP is smaller than the pulse width of the charge control signal DOWN so that the charge pump 12 generates a negative control current Icp. Then, the loop filter 13 reduces the control voltage Cv according to the negative control current Icp so as to control the VCO 14 to lower the frequency of the phase locked clock PLCK. On the contrary, when the phase of the phase locked clock PLCK lags behind that of the input signal IN, the pulse width of the charge control signal UP is greater than the pulse width of the charge control pulse DOWN so that the charge pump 12 generates a positive control current Icp. The loop filter 13 increases the control voltage Cv according to the negative control current Icp so as to control the VCO 14 to rise the frequency of the phase locked clock PLCK.

In the conventional PLL, however, the current mismatch in the charge pump or the logic delay mismatch between the up and down paths may cause phase errors between the input signal IN and phase locked clock PLCK even though the input signal IN and clock PLCK have been already locked on a steady state. Therefore, it is important to provide a PLL with low steady state phase errors.

SUMMARY OF THE INVENTION

In view of the above-mentioned problems, an object of the invention is to provide a PLL with low steady state phase errors. The PLL utilizes a delay unit to delay the phase of an input signal or a reference clock so as to compensate for the circuit property.

Another object of the invention is to provide a calibration circuit for a PLL with low steady state phase errors.

To achieve the above-mentioned object, the calibration circuit for the PLL with low steady state phase errors of the invention includes a clock generator, a delay unit, a phase detector, a charge pump, an integrator, a delay time control unit and a voltage control oscillator. The voltage control oscillator generates a phase locked clock according to a reference control voltage. The clock generator provides a simulation input signal and a simulation reference clock, which have the same phases or close phases, according to the phase locked clock. The delay unit delays the phase of the simulation reference clock and generates a delayed reference clock. The phase detector receives the simulation input signal and the delayed reference clock and outputs charge control signals according to the phase difference between the signals. The charge pump receives the charge control signals and outputs a control current according to the charge control signals. The integrator integrates the control current and generates an error voltage. The delay time control unit generates a delay time control signal for the delay unit according to the error voltage.

The PLL with low steady state phase errors utilizes a delay unit to delay the phase of the input signal or the reference clock so as to compensate for circuit property of the PLL and lower the steady state phase errors of the PLL. The delay time for the delay unit is controlled by the delay time control signal generated from the delay time control unit.

DETAILED DESCRIPTION OF THE INVENTION

The PLL with low steady state phase errors and calibration circuit for the PLL of the present invention will be described with reference to the accompanying drawings.

In a typical PLL, even if the input signal IN and the phase locked clock PLCK are phase locked in a steady state, phase errors may still occur in the signal IN and the clock PLCK. In order to overcome the problem, the principle of the PLL with low steady state phase errors of the present invention utilizes a delay unit to delay the phase locked clock or the input signal by a period of time so as to reduce the phase difference in the phase locked steady state between the input signal IN and the phase locked clock PLCK. Hence, during the steady state of the PLL of the invention, phase errors of the two signals that are inputted to the phase detector may be decreased to thus lower the steady state phase errors.

Figure 1:
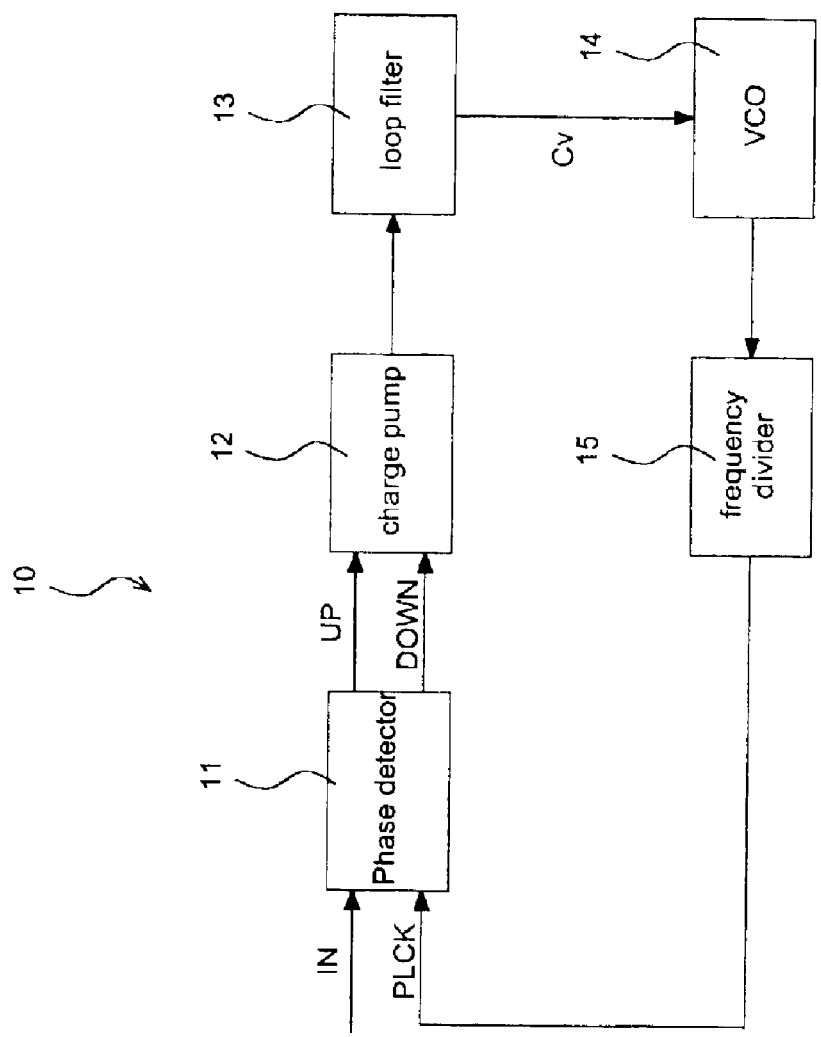
FIG. 1 is a block diagram of a conventional PLL.
Figure 2:
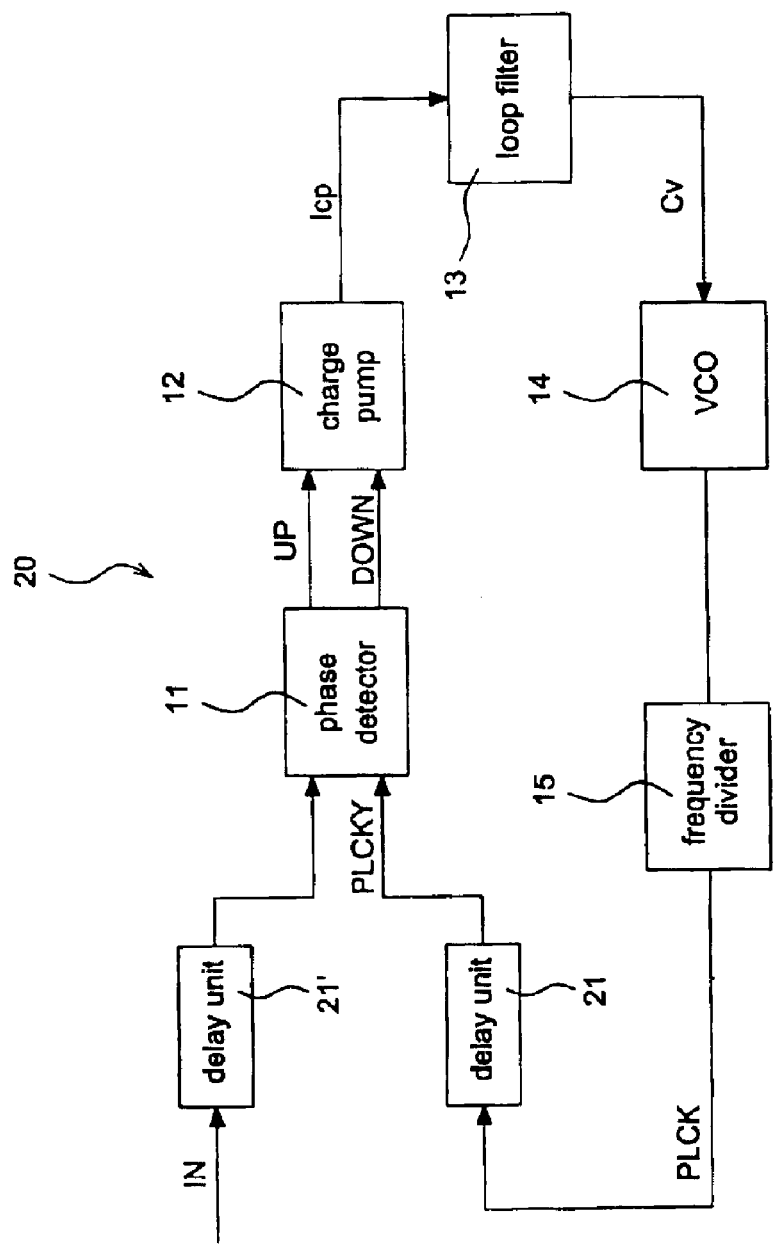
FIG. 2 is a block diagram of the PLL with low steady state phase errors of the present invention.

FIG 2 shows a block diagram of the PLL with low steady state phase errors of the present invention. Referring to FIG 2, in addition to a phase detector 11, a charge pump 12, a loop filter 13, and a voltage control oscillator (VCO) 14, the PLL 20 with low steady state phase errors of the present invention further includes a delay unit 21 between the VCO 14 and the phase detector 11. Of course, a delay unit 21' may be arranged between the input signal iN and the phase detector 11 and a frequency divider 15 may be interposed between the delay unit 21 and the VCO to divide the frequency of a phase locked clock PLCK outputted from the VCO 14. Because the functions and configurations of the phase detector 11, charge pump 12, loop filter 13, and VCO 14 have been described in the prior art, detailed descriptions thereof will be omitted.

The delay unit 21 receives the phase locked clock PLCK of the VCO 14, delays the phase locked clock PLCK by a period of time, and generates a reference clock PLCKY. The phase detector 11 detects the phase difference between the input signal IN and the reference clock PLCKY, and generates the charge control signals UP and DOWN to control the charge pump 12 according to the phase difference. Since the PLL 20 of the present invention utilizes the delay unit 21 to delay the reference clock PLCKY or the input signal IN, the circuit property of the PLL may be compensated. Thus, when the PLL 20 of the invention is in a steady state, the phase errors between the two signals inputted to the phase detector are lowered, and the steady state phase errors are lowered accordingly. As for the delay time for the delay unit 21, a calibration circuit is used to calculate the delay time for the delay unit 21.

Figure 3:
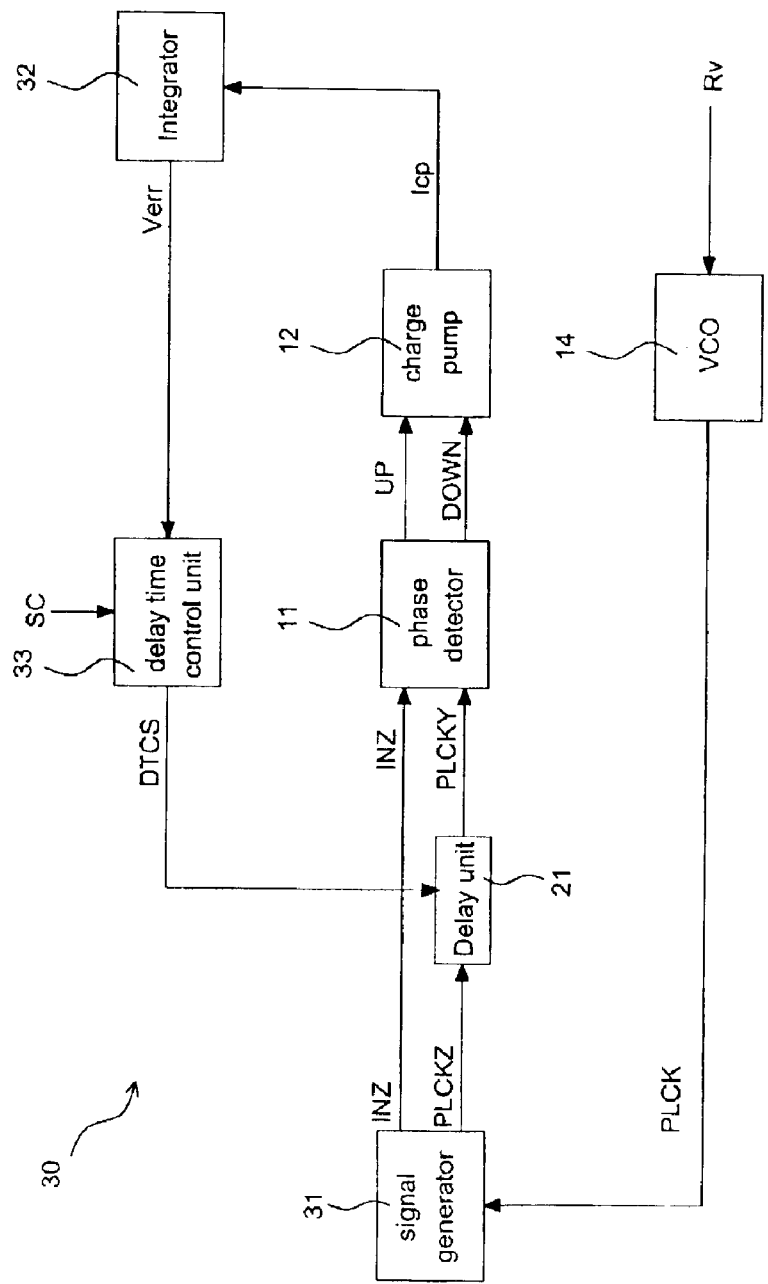
FIG. 3 is a block diagram of a calibration circuit for the PLL with low steady state phase errors of the invention.

FIG. 3 shows a block diagram of a calibration circuit for the PLL with low steady state phase errors of the present invention. The calibration circuit 30 is used to calculate the delay time for the delay unit 21 of the PLL 20 with low steady state phase errors of the present invention. The calibration circuit 30 includes a phase detector 11, a charge pump 12, a VCO 14, a signal generator 31, a delay unit 21, an integrator 32, and a delay time control unit 33. Of course, the calibration circuit 30 may also include a frequency divider (not shown) interposed between the VCO 14 and the signal generator 31 to divide the frequency of the phase locked clock PLCK outputted from the VCO 14 in advance. Of course, the delay unit 21 may be also arranged between the simulation input signal INZ and the phase detector 11.

Figure 6:
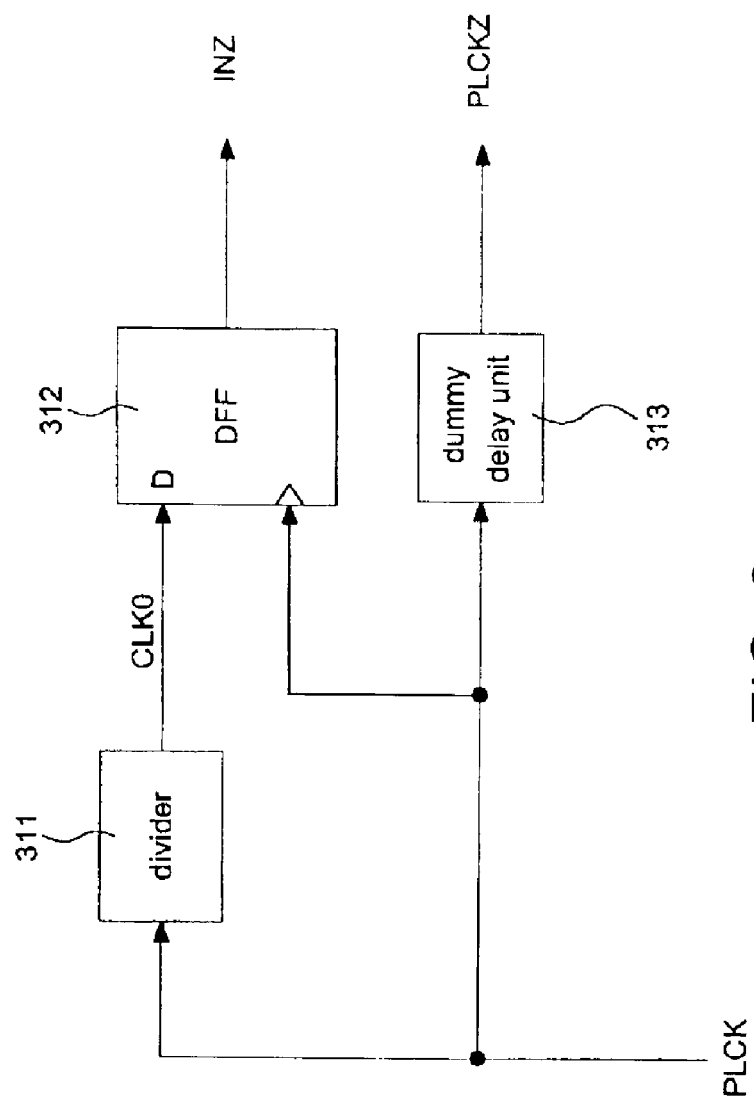
FIG. 6 is a block diagram of the signal generator of the calibration circuit in FIG. 3.

The calibration circuit 30 employs the signal generator 31 to generate two clocks, both of which have close phases or the same phase, according to the phase locked clock PLCK. One of the two clocks is defined as a simulation input clock INZ, and the other one is defined as a simulation reference clock PLCKZ. FIG. 6 shows an embodiment of the signal generator 31. The signal generator 31 includes a divider 311, a flip-flop 312 and a dummy delay unit 313. The divider 311 receives the phase locked clock PLCK and generates a desired clock CLK0 with lower frequency according to the clock PLCK. The flip-flop 312 receives the clock CLK0 and generates the simulation input clock INZ triggered by the clock PLCK. The dummy delay unit 313 receives the clock PLCK and outputs the simulation reference clock PLCKZ, and the delay time of the dummy delay unit 313 substantially equals to the delay time of the flip-flop 312. Therefore, the simulation input clock INZ and the simulation reference clock PLCKZ may have different frequencies. However, the phase difference between clocks INZ and PLCKZ is almost zero. For the EFM signal of the CD-ROM, for example, the width of each signal is between 3T and 11T, wherein T denotes a basic time unit. Hence, the period of the simulation input clock INZ may be set to be one between 3T and 11T, while the period of the simulation reference clock PLCKZ may be set to be 1T.

In this embodiment, the delay unit 21 delays the simulation reference clock PLCKZ and then generates a delayed reference clock PLCKY. At this time, if the delay time for the delay unit 21 is not zero, a phase difference corresponding to the delay time is occurred between the simulation input clock INZ and the delayed reference clock PLCKY. The phase detector 11 and the charge pump 12 generate a control current Icp according to the phase relationship between the simulation input clock INZ and the delayed reference clock PLCKY. The calibration circuit 30 employs the integrator 32 to receive the control current Icp and then integrate the control current Icp to generate an error voltage Verr. The delay time control unit 33 generates a delay time control signal to control the delay time of the delay unit 21 according to the error voltage Verr.

Figure 4:
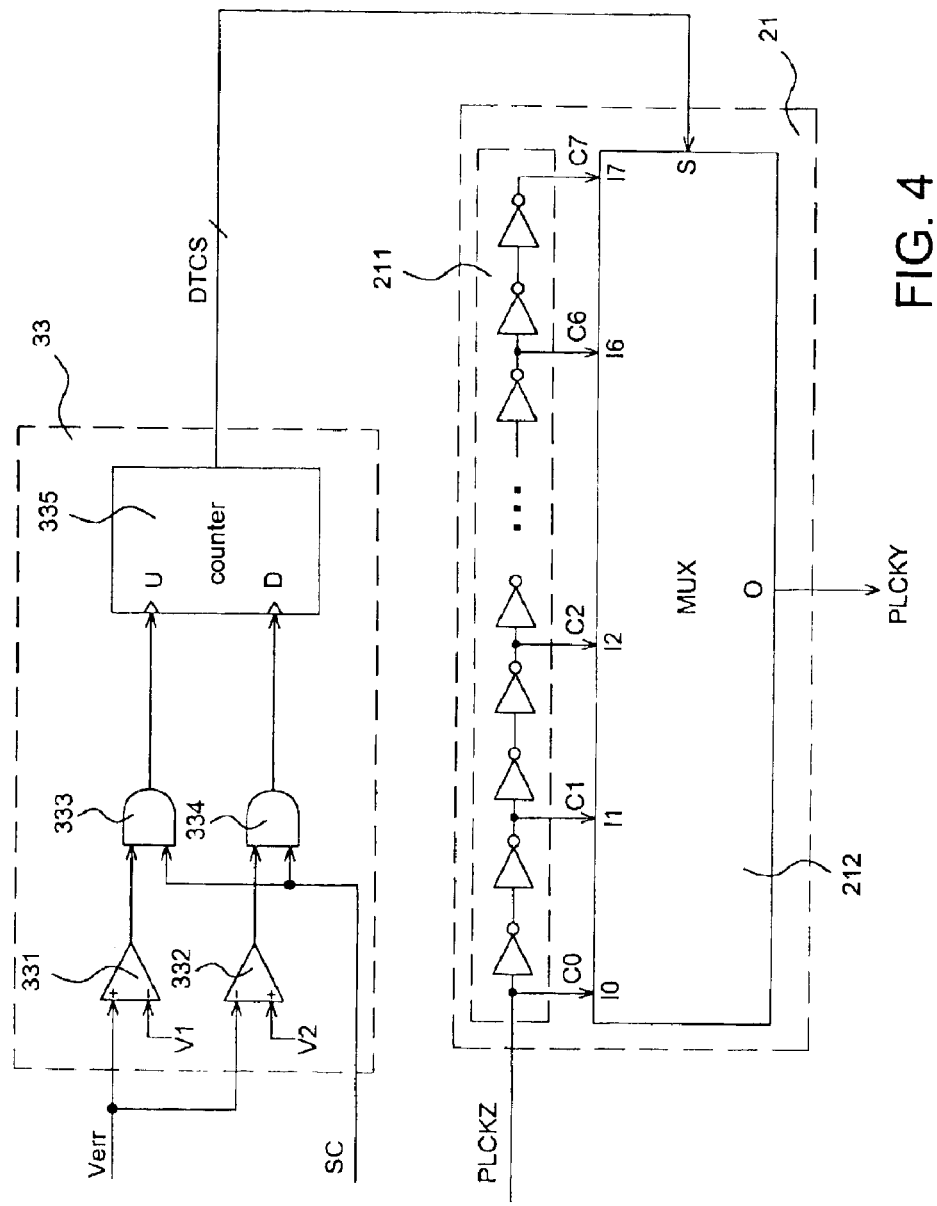
FIG. 4 shows an embodiment of a delay time control unit and a delay unit of the calibration circuit of the present invention.

FIG. 4 shows an embodiment of a delay time control unit and a delay unit of the calibration circuit of the invention. As shown in FIG. 4, the delay time control unit 33 includes comparators 331 and 332, AND gates 333 and 334, and a counter 335. The comparator 331 receives the error voltage Verr, compares the error voltage Verr to a first reference voltage V1, and then generates a first comparison signal. The comparator 332 receives the error voltage Verr, compares the error voltage Verr to a second reference voltage V2, and then generates a second comparison signal. The AND gate 333 receives a trigger clock SC and the first comparison signal and outputs a first pulse signal to the counter 335. The AND gate 334 receives the trigger clock SC and the second comparison signal, and then outputs a second pulse signal to the counter 335. The counter 335 counts up according to the pulse number of the first pulse signal and counts down according to the second pulse signal. The count value of the counter 335 is defined as the delay time control signal DTCS.

The delay unit 21 includes a delay cell 211 and a multiplexer 212. The delay cell 211 includes a plurality of inverters connected in series. The delay cell 211 receives the simulation reference clock PLCKZ, generates signals C0 to C7 with different periods of delay time, and outputs the signals C0 to C7 to the multiplexer 212 simultaneously. The multiplexer 212 receives the delay time control signal DTCS and selects a signal from the signals C0 to C7 according to the delay time control signal DTCS as the delayed reference clock PLCKY.

Assume that the first reference voltage V1 is a positive voltage and the second reference voltage V2 is a negative voltage. When the error voltage Verr is higher than the first reference voltage V1, it represents that the delayed reference clock PLCKY leads the simulation input clock INZ. In this state, the first comparison signal is H, so the counter 335 counts up according to the first pulse signal and changes the delay time control signal DTCS at the positive edge of the trigger clock SC. The multiplexer 212 selects another delay signal with longer delay time as the delayed reference clock PLCKY from the signals C0 to C7 with different periods of delay time according to the delay time control signal DTCS. On the contrary, when the error voltage Verr is lower than the second reference voltage V2, it represents that the delayed reference clock PLCKY lags behind the simulation input clock INZ. In this state, the second comparison signal is H. So, the counter 335 counts down according to the second pulse signal and changes the delay time control signal DTCS at the positive edge of the trigger clock SC. The multiplexer 212 selects another delay signal with shorter delay time as the delayed reference clock PLCKY from the signals C0 to C7 according to the delay time control signal DTCS.

Please refer to FIG. 3 again. Because the simulation input clock INZ and the simulation reference clock PLCKZ generated from the signal generator 31 are almost in the same phase, the error voltage Verr outputted from the integrator 32 should be 0 and the delay time for the delay unit 21 should also be 0 under the ideal condition of the circuit property of the PLL. When the circuit property of the PLL is not ideal and causes the error voltage Verr outputted from the integrator 32 to be nonzero, the delay time control unit 33 may generate a delay time control signal DTCS to control the delay time for the delay unit 21 according to the value of the error voltage Verr.

Figure 5:
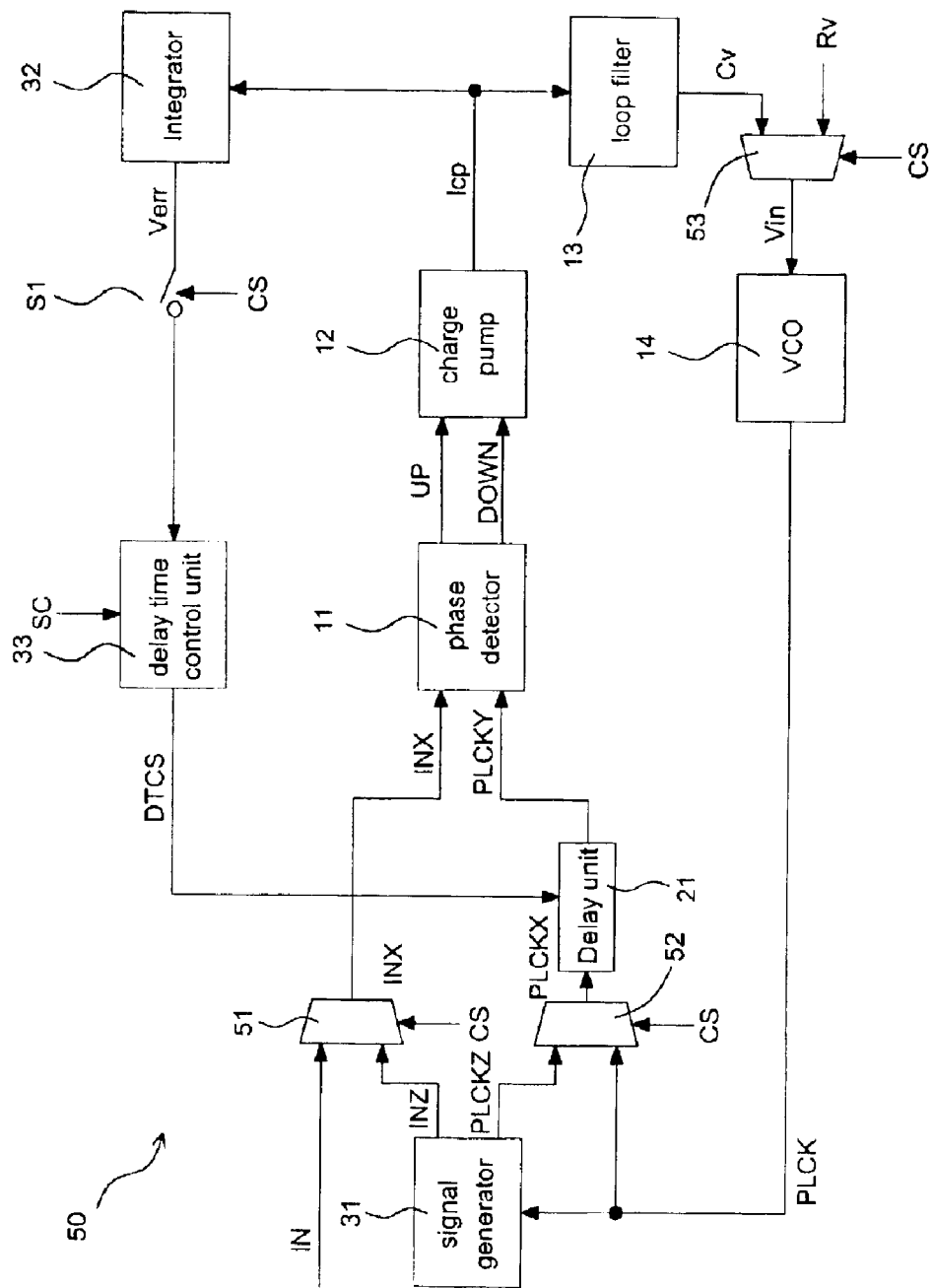
FIG. 5 is a block diagram of the PLL with low steady state phase errors and a calibration circuit of the invention.

FIG. 5 shows a block diagram of the PLL with low steady state phase errors and a calibration circuit of the present invention. The PLL 50 includes a phase detector 11, a charge pump 12, a loop filter 13, a VCO 14, a signal generator 31, a delay unit 21, an integrator 32, a delay time control unit 33, and three multiplexers 51, 52 and 53. Of course, the delay unit 21 may be arranged between the multiplexer 51 and the phase detector 11. The PLL 50 may also include a frequency divider (not shown) interposed between the VCO 14 and the signal generator 31 to divide the frequency of the oscillation clock outputted from the VCO 14. The PLL 50 of FIG. 5 is a combination of the PLL 20 of FIG. 2 and the calibration circuit 30 of FIG. 3, wherein three multiplexers 51, 52 and 53 are utilized to switch the signals between the correction mode and the operation mode, and the switch signal CS is used to control the actions of the multiplexers 51, 52 and 53.

The PLL 50 utilizes the multiplexer 51 to select the input signal IN or the simulation input signal INZ generated from the signal generator 31 as the signal INX. The PLL 50 utilizes the multiplexer 52 to select the oscillation clock PLCK of the VCO 14 or the simulation reference clock PLCKZ generated from the signal generator 31 as the signal PLCKX. The PLL 50 utilizes the multiplexer 53 to select the control voltage Cv of the loop filter 13 or the reference voltage Rv as the signal Vin.

Therefore, when the switch signal CS is enabled, the PLL 50 is under a correction mode. At this time, the multiplexer 51 outputs the simulation input signal INZ generated from the signal generator 31 as the signal INX, the multiplexer 52 outputs the simulation reference clock PLCKZ generated from the signal generator 31 as the signal PLCKX, and the multiplexer 53 outputs the reference voltage Rv as the signal Vin. Meanwhile, the switch SI also switches on so that the error voltage Verr may be outputted to the delay time control unit 33. Consequently, the delay time control unit 33 generates the delay time control signal DTCS to adjust the delay time for the delay unit 21 according to the error voltage Verr of the integrator 32.

On the contrary, after the calibration is finished, the switch signal CS is disabled so that the PLL 50 is under the operation mode. At this time, the multiplexer 51 outputs the input signal IN as the signal INX, the multiplexer 52 outputs the oscillation clock PLCK of the VCO 14 as the signal PLCKX, and the multiplexer 53 outputs the control voltage Cv of the loop filter 13 as the signal Vin. Meanwhile, the switch S1 switches off so that the error voltage Verr may not be outputted to the delay time control unit 33. Consequently, the delay time for the delay unit 21 is kept constant. In the calibration mode, the delay time control unit 33 has calculated the preferred delay time to compensate for the circuit property of the PLL 50. Therefore, when the PLL 50 is under the operation mode, it has lower steady state phase errors.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art. For example, two sets of delay units may be adopted to delay the phases of the reference clock and the input clock, respectively, although only one set of delay unit is adopted in the invention.

What is claimed is:

1. A phase locked loop, comprising:
    a voltage control oscillator for generating a phase locked clock;
    a delay unit for receiving the phase locked clock, and generating a delayed clock that is delayed a first predetermined delay time;
    a phase detector for receiving an input signal and the delayed clock, and generating charge control signals according to a phase difference between the input signal and the delayed clock;
    a charge pump for receiving the charge control signals and generating a control current according to the charge control signals; and
    a loop filter for generating a control voltage according to the control current;
    a calibration circuit to calculate the first predetermined delay time and a second predetermined delay time;
    wherein the voltage control oscillator generates the phase locked clock according to the control voltage.

2. A calibration circuit for calibrating delay time of a phase locked loop, the phase locked loop comprising a delay unit, a phase detector, a charge pump, a loop filter, and a voltage control oscillator for generating a phase locked clock, the calibration circuit comprising:
    the voltage control oscillator receiving a reference control voltage and generating the phase locked clock;
    a signal generator for generating a simulation input signal and a simulation reference clock, both of which substantially have no phase difference, according to the phase locked clock;
    the delay unit receiving the simulation reference clock and outputting a delayed clock that is delayed a first predetermined delay time;
    the phase detector receiving the simulation input signal and the delayed clock, and generating charge control signals according to the phase difference between the simulation input signal and the delayed clock;
    the charge pump receiving the charge control signals and generating a control current according to the charge control signals;
    an integrator for generating an error voltage by integrating the control current; and
    a delay time control unit for generating a delay time control signal to control the first predetermined delay time of the delay unit according to the error voltage.

3. The calibration circuit according to claim 2, further comprising a frequency divider interposed between the voltage control oscillator and the signal generator to divide a frequency of the phase locked clock.

4. The calibration circuit according to claim 2, wherein the delay time control unit comprises:
    a first comparison unit for comparing the error voltage to a first comparison voltage and generating a first comparison signal;
    a second comparison unit for comparing the error voltage to a second comparison voltage and generating a second comparison signal; and
    a counter for up counting when the first comparison signal is enabled, down-counting when the second comparison signal is enabled, and generating a count value as the delay time control signal.

5. The calibration circuit according to claim 4, wherein the delay unit comprises:

a delay cell having inverter connected in series for receiving the simulation reference clock and generating a plurality of delay signals with different periods of delay time; and a multiplexer for selecting one of the plurality of delay signals as the delayed clock according to the delay time control signal.

6. The calibration circuit according to claim 2, wherein the signal generator comprises:

a divider for receiving the phase locked clock and generating a dividing reference clock;

a flip-flop for receiving the dividing reference clock and phase locked clock as an input signal and a trigger signal, respectively, and generating the simulation input signal; and a dummy delay unit for receiving the phase locked clock and outputting the simulation reference clock;

wherein the delay time of the dummy delay unit substantially equals to the delay time of the flip-flop.

7. A phase locked loop, comprising:

a voltage control oscillator for generating a phase locked clock;

a signal generator for generating a simulation input signal and a simulation reference clock, both of which substantially have no phase difference, according to the phase locked clock;

a first multiplexer for receiving an input signal and the simulation input signal and selecting the input signal or the simulation input signal as a first selecting signal under control of a correction signal;

a second multiplexer for receiving the phase locked clock and the simulation reference clock and selecting the phase locked clock or the simulation reference clock as a second selecting signal under control of the correction signal;

a delay unit for receiving the second selecting signal of the second multiplexer and generating a delayed clock;

a phase detector for detecting the phase error between the first selecting signal and the delayed signal and generating charge control signals;

a charge pump for receiving the charge control signals and generating a control current according to the charge control signals;

a loop filter for generating a control voltage according to the control current;

a third multiplexer for receiving the control voltage and a reference voltage, and selecting the control voltage or the reference voltage as a third selecting signal under control of the correction signal; and a delay time control unit for generating a delay time control signal to adjust the delay time of the delay unit according to the control voltage;

wherein the voltage control oscillator generates the phase locked clock according to the third selecting signal.

8. The phase locked loop according to claim 7, wherein the first multiplexer comprises:

a first switch connecting the input signal to the phase detector and turning off when a correction signal is enabled; and a second switch connecting the simulation input signal to the phase detector and switching on when the control signal is enabled.

9. The phase locked loop according to claim 7, wherein the second multiplexer comprises:

a third switch connecting the phase locked clock to the delay unit and turning off when a correction signal is enabled; and a fourth switch connecting the simulation reference clock to the delay unit and switching on when the correction signal is enabled.

10. The phase locked loop according to claim 7, wherein the third multiplexer comprises:

a fifth switch connecting the loop filter to the voltage control oscillator and turning off when a correction signal is enabled; and a sixth switch connecting the reference voltage to the voltage control oscillator and switching on when the correction signal is enabled.

11. The phase locked loop according to claim 7, wherein the delay time control unit comprises:

a first comparison unit for comparing the control voltage to a first comparison voltage and outputting a first comparison signal;

a second comparison unit for comparing the control voltage and a second comparison voltage and outputting a second comparison signal; and a counter for up counting when the first comparison signal is enabled, down-counting when the second comparison signal is enabled, and outputting a count value as the delay time control signal.

12. The phase locked loop according to claim 11, wherein the delay unit comprises:

a delay cell having inverter connected in series for receiving the simulation reference clock and generating a plurality of delay signals with different periods of delay time; and a multiplexer for selecting one of the plurality of delay signals as the delayed clock according to the delay time control signal.

13. The phase locked loop according to claim 7, wherein the signal generator comprises:

a divider for receiving the phase locked clock and generating a dividing reference clock;

a flip-flop for receiving the dividing reference clock and phase locked clock as an input signal and a trigger signal, respectively, and generating the simulation input signal; and a dummy delay unit for receiving the phase locked clock and outputting the simulation reference clock;

wherein the delay time of the dummy delay unit substantially equals to the delay time of the flip-flop.

* * * * *